United States Patent
Rosefield et al.

(10) Patent No.: US 7,122,456 B2
(45) Date of Patent: Oct. 17, 2006

(54) METHOD FOR REDUCED INPUT OUTPUT AREA

(75) Inventors: Peter L. Rosefield, Stouffville (CA); Harvest W. C. Chung, Scarborough (CA)

(73) Assignee: ATI Technologies, Inc., Toronto (CA)

( * ) Notice: Subject to any disclaimer, the term of this patent is extended or adjusted under 35 U.S.C. 154(b) by 26 days.

(21) Appl. No.: 10/988,684

(22) Filed: Nov. 15, 2004

(65) Prior Publication Data
US 2005/0087888 A1 Apr. 28, 2005

Related U.S. Application Data

(62) Division of application No. 09/724,597, filed on Nov. 28, 2000, now Pat. No. 6,833,620.

(51) Int. Cl.
*H01L 21/44* (2006.01)

(52) U.S. Cl. .............. 438/598; 438/612; 438/618; 438/665; 438/666; 438/669; 438/128

(58) Field of Classification Search ........... 438/598, 438/612, 618, 665, 666, 669, 128
See application file for complete search history.

(56) References Cited

U.S. PATENT DOCUMENTS

| | | | |
|---|---|---|---|
| 5,286,656 A | 2/1994 | Keown et al. | |
| 5,543,958 A | 8/1996 | Lebby et al. | |
| 5,895,967 A | 4/1999 | Stearns et al. | |
| 5,942,766 A | 8/1999 | Frei | |
| 6,008,533 A | 12/1999 | Bruce et al. | |
| 6,130,484 A | 10/2000 | Kameda et al. | |
| 6,207,548 B1 | 3/2001 | Akram et al. | |
| 6,319,750 B1 | 11/2001 | Huang et al. | |
| 6,365,978 B1 | 4/2002 | Ibnabdeljalil et al. | |
| 6,372,409 B1 | 4/2002 | Yu | |
| 6,477,046 B1 | 11/2002 | Stearns et al. | |
| 6,518,787 B1 | 2/2003 | Allegrucci et al. | |
| 6,638,793 B1 * | 10/2003 | Chen | 438/123 |
| 6,642,064 B1 | 11/2003 | Terrill et al. | |
| 6,747,349 B1 | 6/2004 | Al-Dabagh et al. | |
| 2001/0010408 A1 | 8/2001 | Ker et al. | |
| 2001/0010471 A1 | 8/2001 | Ngai et al. | |
| 2001/0011768 A1 | 8/2001 | Kohara et al. | |
| 2001/0011771 A1 | 8/2001 | Yoshida | |
| 2002/0109240 A1 | 8/2002 | Taylor et al. | |
| 2002/0191383 A1 | 12/2002 | Corisis et al. | |

* cited by examiner

*Primary Examiner*—George Fourson
*Assistant Examiner*—Thanh V. Pham

(57) ABSTRACT

An input output ring for a semiconductor device is disclosed that uses power buffers having widths that vary from the widths of the input and output buffers. In one embodiment, the pitches between bond pads are the same, in another embodiment the pitches between the bond pads can vary. In another embodiment, the number of bond pads is greater than the number of associated active buffer areas. By connecting two power bond pads to a common buffer the inductance associated with the buffer is reduced, thereby reducing the number of active buffers needed to be dedicated to providing power to the semiconductor device.

13 Claims, 5 Drawing Sheets

-- PRIOR ART --

-- PRIOR ART --

-- PRIOR ART --

METHOD FOR REDUCED INPUT OUTPUT AREA

CROSS-REFERENCE TO RELATED APPLICATIONS

The present application is a divisional of U.S. patent application Ser. No. 09/724,597, filed on Nov. 28, 2000 now U.S. Pat. No. 6,833,620 and entitled "Apparatus Having Reduced Input Output Area and Method Thereof," and having a common inventor and assignee.

FIELD OF THE DISCLOSURE

The present disclosure relates generally to semiconductor devices, and more particularly to the layout of input output (IO) buffers associated with semiconductor devices.

BACKGROUND OF THE DISCLOSURE

Reduction in size of semiconductor devices continues to be an important objective in the design and manufacture of such devices. Generally, semiconductor devices comprise an input output (IO) ring and a logic core as illustrated in FIG. 1. The logic core generally contains combinational and state machine logic to implement specific features of the semiconductor device. The IO ring generally contains signal buffers, and power buffers. Signal buffers include input buffers, output buffers, and bi-directional buffers. Input buffers receive and condition input signals from external to the semiconductor device for use by the logic core. Output buffers receive and condition output signals from the logic core for use external to the semiconductor device. Bi-directional buffers offer the functionality of both input buffers and output buffers. Power buffers provide fixed voltage references and/or supply voltages, such as Vdd and Vss to the semiconductor device.

The minimum number of power buffers needed by a semiconductor device is defined by the number of power buffers needed to prevent a supply voltage related failure from occurring for a specified maximum amount of direct current (DC) needed by the semiconductor device. Generally, supply voltage related failure mechanisms can occur. First, a power buffer can fail when it carries too much current. For example, a power buffer can be physically damaged when it carries too much current. Therefore, by increasing the number of power buffers used, the amount of current through each one can be reduced to assure the power buffers are not physically damaged. A second failure mechanism occurs when the inductance of bond wires prevents enough current from reaching the semiconductor device. During high speed transitions in logic value, output buffer transistors can produce a high current. This high current, in turn, can impress a noise voltage on the low and high power supply buses as a result of a bonding wire, packaging and other inductances that prevent enough current from reaching the semiconductor device. Note that the impressed voltage is given by v=L (di/dt), where v is the noise voltage, L is the inductance of the bonding wire, packaging, etc., and di/dt is the derivative of the current generated by the large driver transistors of the output buffer with respect to time. Thus, the more rapidly that the current of large driver transistors vary in time, the greater the magnitude of the impressed noise signal. This undesirable noise voltage on the high and low power supply buses is commonly referred to as "ground bounce." A primary contributor to ground bounce is the bond wire connecting a die to its package. To limit the amount of ground bounce, the number of power buffers for the device are increased, which can result in a significant number of power buffers.

Prior art FIG. 2 illustrates a semiconductor device having a logic core generally square in shape having seven IO devices on each side. Assuming that all the logic core area is used to implement features of the semiconductor device, the logic core device of FIG. 2 is ideally laid out in that the combined width the 7 IO pads is equal to the width of the logic core. If the logic core illustrated in FIG. 2 were smaller, and the same IO were needed, it would not be possible to reduce the overall size of the semiconductor device without changing the width of the IO buffers. The width of the IO buffers can be modified by relaying out each IO buffer. Relaying out buffers is not always a feasible option. Not only is relaying out IO buffers a time consuming process, but there is a practical limit to the extent that the width of IO buffers can be reduced.

FIG. 3 illustrates three adjacent bond pads. The pitch between immediately adjacent bond pads of FIG. 3 have a minimum distance, below which bonding to the pads cannot be properly performed. Therefore, the width of an IO buffer can be limited by the minimum pitch which must be maintained. In addition, FIG. 3 illustrates that each IO buffer includes a bond pad area and an active buffer area, such that the bond pad areas form a bond pad ring within the IO ring illustrated in FIG. 1.

Therefore, a method and/or apparatus capable of reducing the overall area utilized by the IO ring portion of a semiconductor device would be useful.

Figure 1:
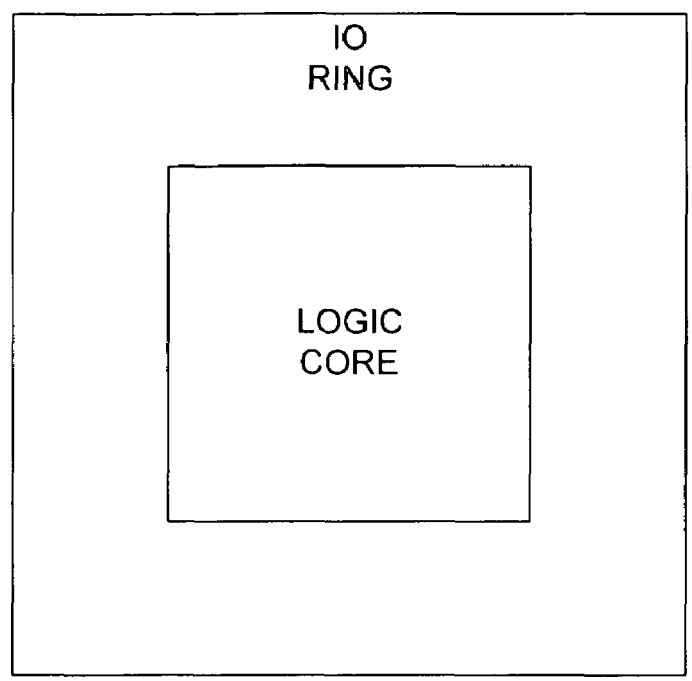
FIG. 1 illustrates a floor plan of a semiconductor device in accordance with the prior art.
Figure 2:
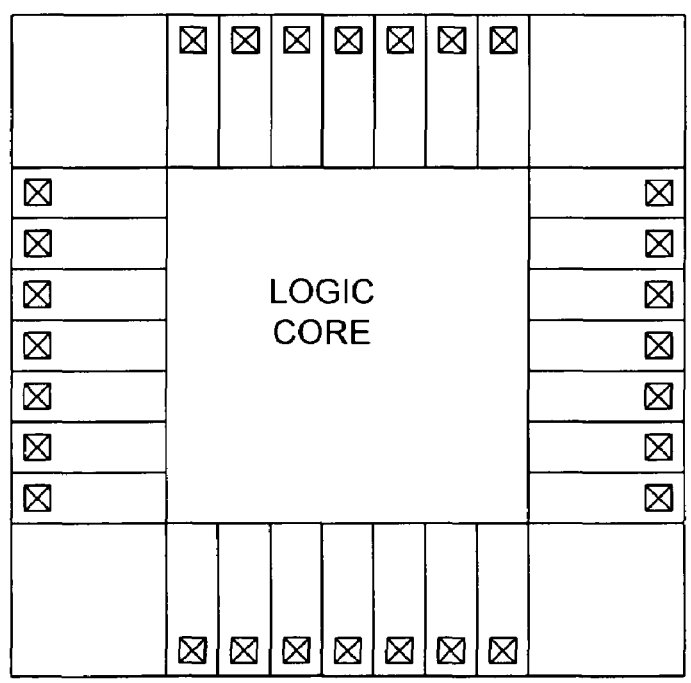
FIG. 2 illustrates a more detailed embodiment of the prior art floor plan of FIG. 1.
Figure 3:
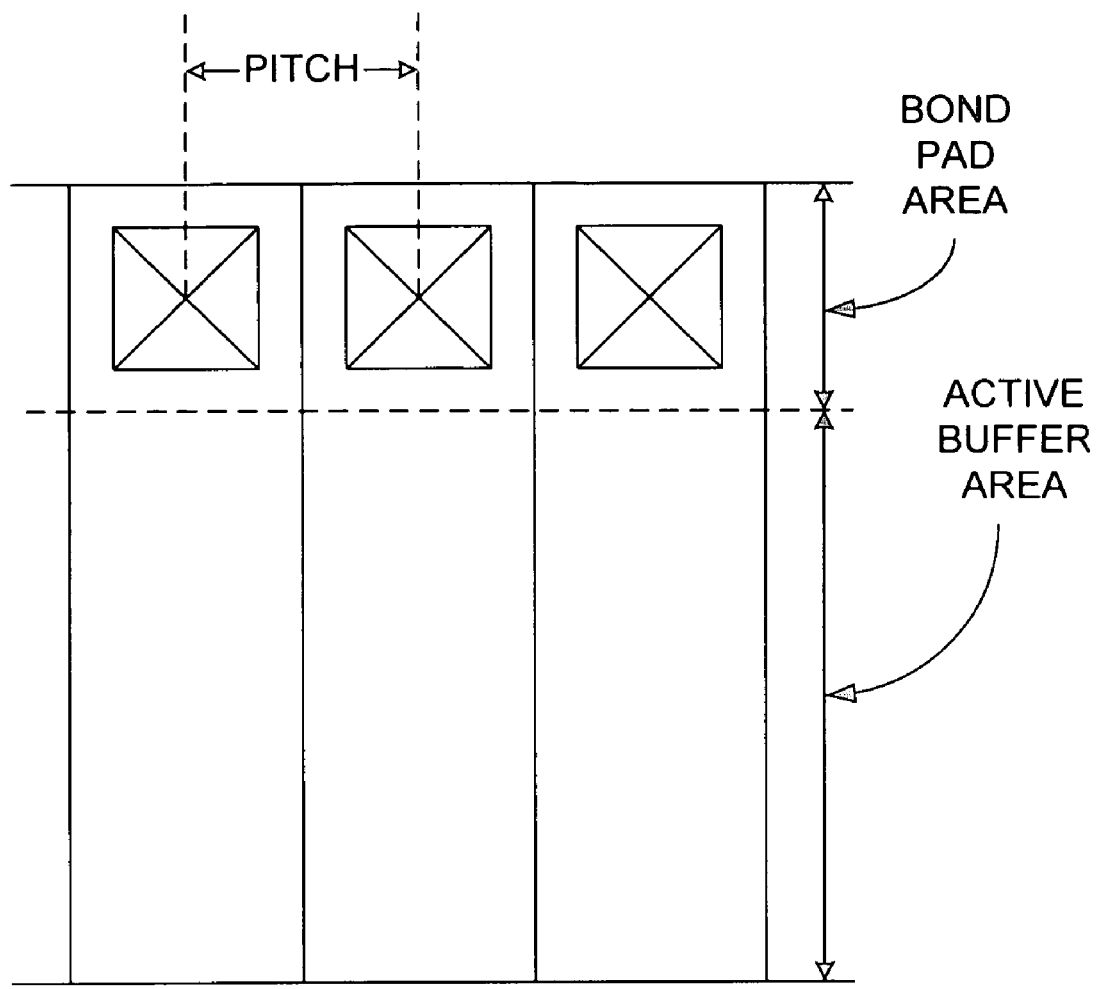
FIG. 3 illustrates three IO buffers from the prior art IO ring of FIG. 1.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION OF THE DRAWINGS

In accordance with a specific embodiment of the present disclosure, the number of bond pads for an IO ring of a semiconductor device is greater than the number of active buffers associated with the bond pads. At least two of the bond pads are connected together so that the inductance at a pad connected to a reference or supply voltage is reduced. In other embodiments of the disclosure, the width of power buffers can vary from the width of input and output buffers. The present disclosure is described herein with specific embodiments illustrated in FIGS. 4–7.

Figure 4:
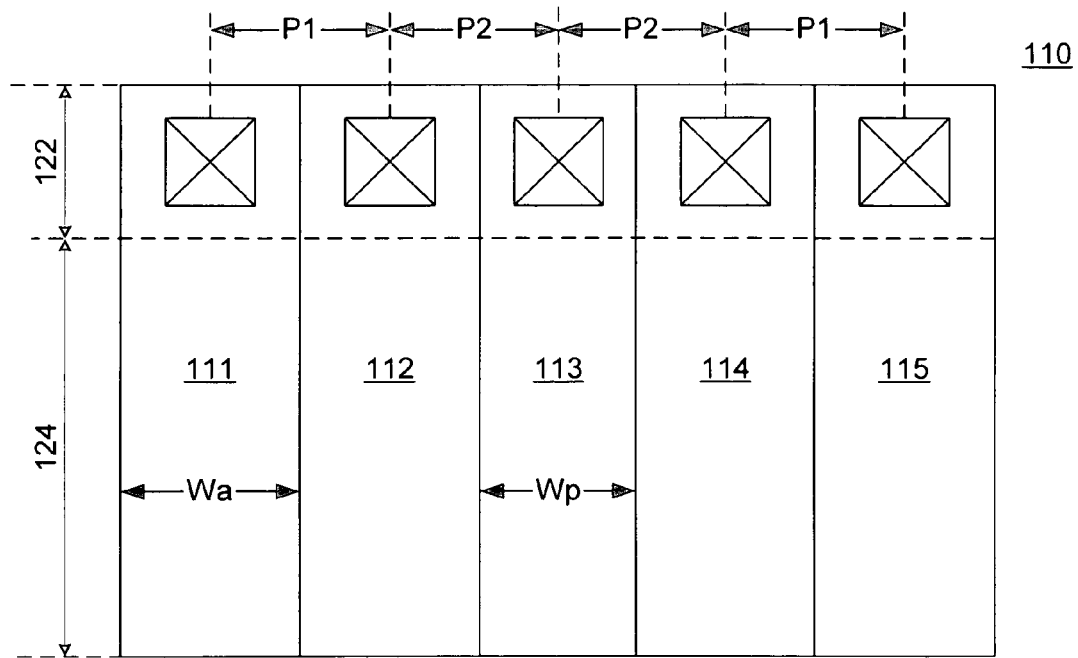
FIG. 4 illustrates a plan view of IO buffers in accordance with an embodiment of the present disclosure.

FIG. 4 illustrates a specific embodiment for a set of IO buffers 110 for reducing the overall area used by the IO ring. Specifically, FIG. 4 illustrates five IO buffers 111–115. IO buffers 111–112, and 114–115 represent active buffers that receive and transmit signals to and from the logic core of the semiconductor device. IO buffer 113 is a power buffer used to provide a voltage reference to the semiconductor device. For example, buffer 113 will typically provide either a power or ground signal to the semiconductor device.

Each of the active buffers 111, 112, 114, and 115 have a common width (Wa), while the IO buffer 113 has a different width (Wp). The width of the active buffers 111, 112, 114, and 115 is generally based on the circuitry required within the active buffer portion 124. The logic portions within the active buffer portions 124 can include buffer-in logic, pre-driver logic, pre-buffer logic, output drivers, and input protection circuitry. Likewise, the width of the power buffer 113 is dictated by the circuitry used within its active area. However, since power buffers do not have to condition active signals, the circuitry required is generally limited to surge protection devices and interconnects. Therefore, the width of a power input output buffer can be less than the width of an active IO buffer.

Therefore, in the implementation illustrated in FIG. 4, the overall area of an IO ring is reduced by allowing the power IO buffers to have a different width than the active IO buffers. In one implementation, the width of the power buffer will be limited by the minimum pad size needed for packaging. As illustrated, the pitch between the bond pad of power buffer 113 and the pitch between the bond pads of buffers 112 and 114 is a pitch P2, while the pitch between active buffers 111–112, and 114–115 is a larger pitch P1. Having a non-uniform pitch between bond pads requires packaging equipment capable of receiving specific locations for each bond pad, but allows for a reduction in the overall area of the IO ring.

Therefore, the specific implementation of FIG. 4 makes it is possible to reduce the overall area occupied by the IO buffers through the use of power buffers having different widths and pitches than the other buffers.

Figure 5:
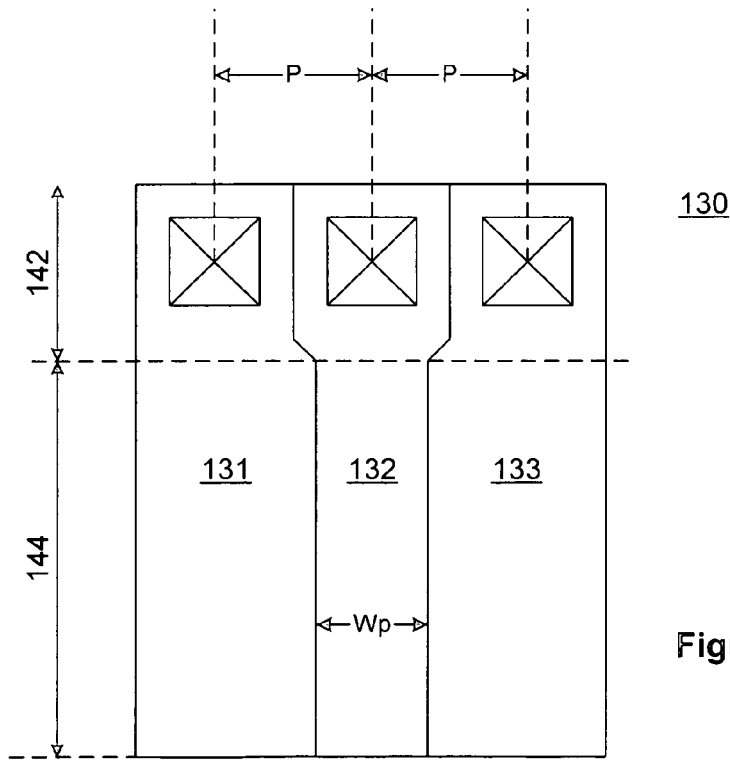
FIG. 5 illustrates a plan view of IO buffers in accordance with another embodiment of the present disclosure.

FIG. 5 illustrates a specific embodiment of a set of IO buffers 130 representing a portion of the overall area used by the IO ring. The buffer set 130 maintains a uniform pitch between the IO pads, thereby simplifying aspects of the packaging processes, and allowing a smaller overall pitch. However, variable widths are allowed within the active buffer area 144 of the buffers 131–133. Specifically, the width of the active buffer portion 144 of power buffer 132 is less than the width of the active buffer portion of buffers 131 and 133. This is possible because the area needed to implement the active buffer portion of a power buffer 132 is generally less than the area needed to implement an active buffer. In effect, there is an overlapping of the active buffer area 144 of active buffers 131 and 133 with the bond pad area 142 of power buffer 132. This overlap results in a smaller area utilized by the set of IO buffers 131–133, and thereby a smaller area utilized by the IO ring overall. Therefore, the implementation of IO buffers using the overlap methodology illustrated in FIG. 5 allows for a common pitch to be maintained between the bond pads, and for the power buffer 132 to have a different active buffer area width. It will be appreciated that once laid out, the buffer set 130 can be treated as a single element during the layout of the IO ring. By allowing the width of the active area of power bond pads to vary from the width of active buffers it is possible to reduce the overall area of the IO ring.

Figure 6:
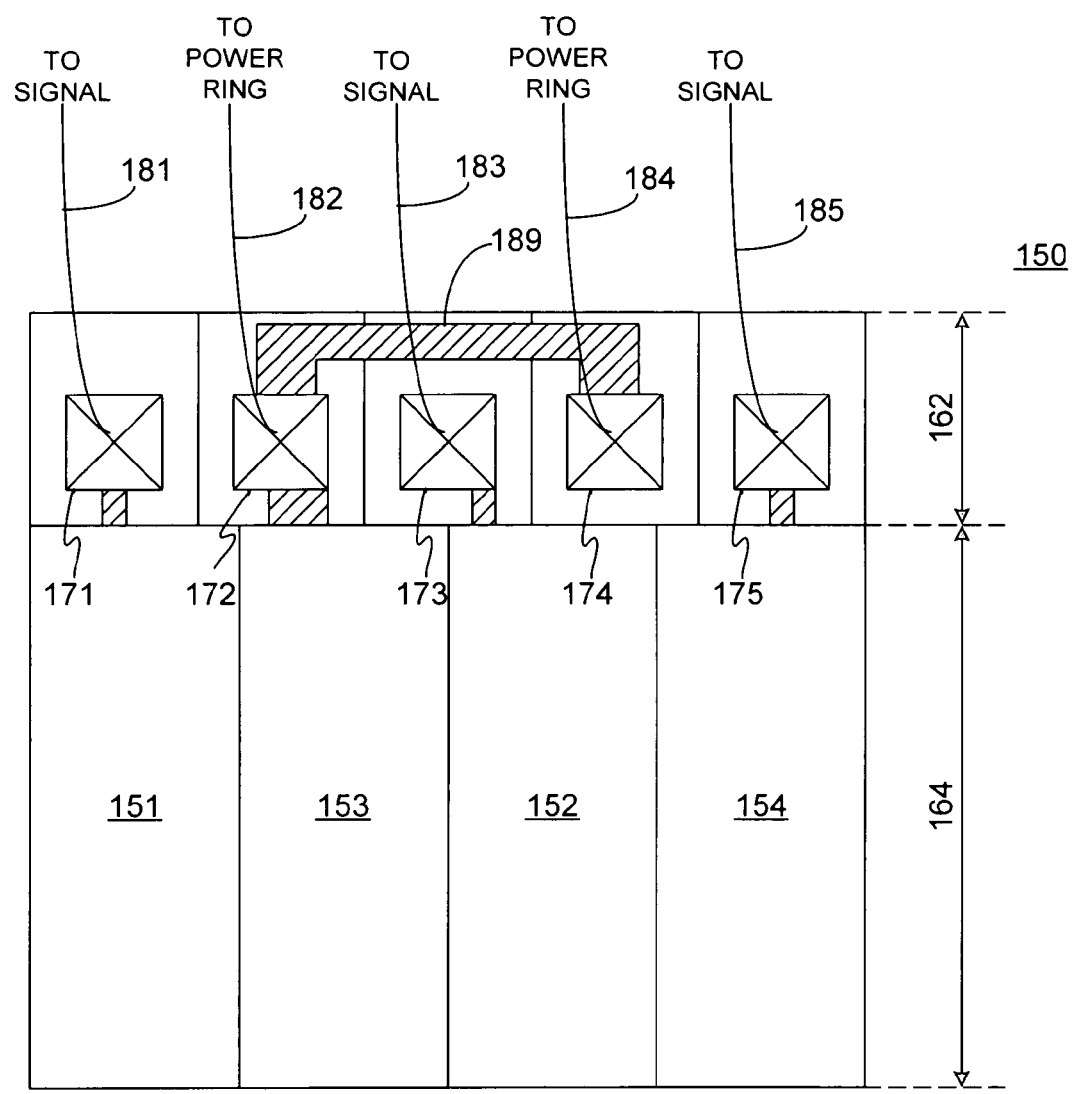
FIGS. 6 and 7 illustrate plan views of IO buffers in accordance with specific embodiments of the present disclosure.

FIG. 6 illustrates a set of bonded IO buffers 150, such as may be part of a packaged device, representing a specific embodiment of reducing the overall area used by the IO ring of a semiconductor device. In accordance with the specific implementation of FIG. 6, the number of bond pads for a given width of the IO ring is greater than the number of active buffer regions associated with the given width. In the specific implementation illustrated in FIG. 6, five bond pads 171–175 are laid out in the same width as four active buffer areas 151–154.

As a result, in the embodiment illustrated, only four of the bond pads are directly connected to the active buffer regions 151–154 as illustrated by the shaded traces. The bond pad 174 is not directly connected to an active buffer area, but is instead connected to the bond pad 172 by trace 189 within the bond pad ring portion 162 of the device to create an electrical connection. Note that in the embodiment illustrated, a portion of the trace is between the bond pads and the outer periphery of the die's IO ring. In another embodiment, the trace connecting the bond pads can be between the active region and the bond pads, or within the active region.

The primary influence on the number of power and ground buffers needed in a semiconductor device is the inductance of the bond wires from the package substrate to the semiconductor die. The effect of this inductance is to limit the amount of current that can be received over a specific period of time. In accordance with a specific embodiment of the present disclosure, a wire bond connection 182 is made between bond pad 172 and the package (not shown), and a wire bond connection 184 is made between bond pad 174 and the package substrate. In one embodiment, a portion of the package substrate provides a structure that allows for a power connection to be made. Such a structure may be a ring or individual structures that can be electrically connected, to which the wire bond connections 182 and 184 are connected. Because two wire bonds are used, the effective inductance seen by the power buffer 153 is effectively halved, resulting in a greater instantaneous current flow to the power buffer 153. Therefore, the use of two bond pads 172 and 174 as power bond pads has the effect of reducing the number of needed active power buffers by 1, since the single active power buffer will receive approximately twice the current. Therefore, in this implementation the size of the IO ring can be reduced by one power buffer.

An additional advantage of the layout of FIG. 6 is that electrical cross talk between the signal received at pad 173 and signals received at pads 171 and 175 is reduced, since the distance between switching signals is increased, and a steady state on bond wires 182 and 184 can help isolate the signal on bond wire 183 from the other active signal. Note that in an alternate embodiment, more that one pad can reside between pads 172 and 174. For example, two or more pads can create a pad set that is immediately adjacent to the pads 172 and 174. Generally, each member of the pad set will be routed to its own active buffer.

Figure 7:
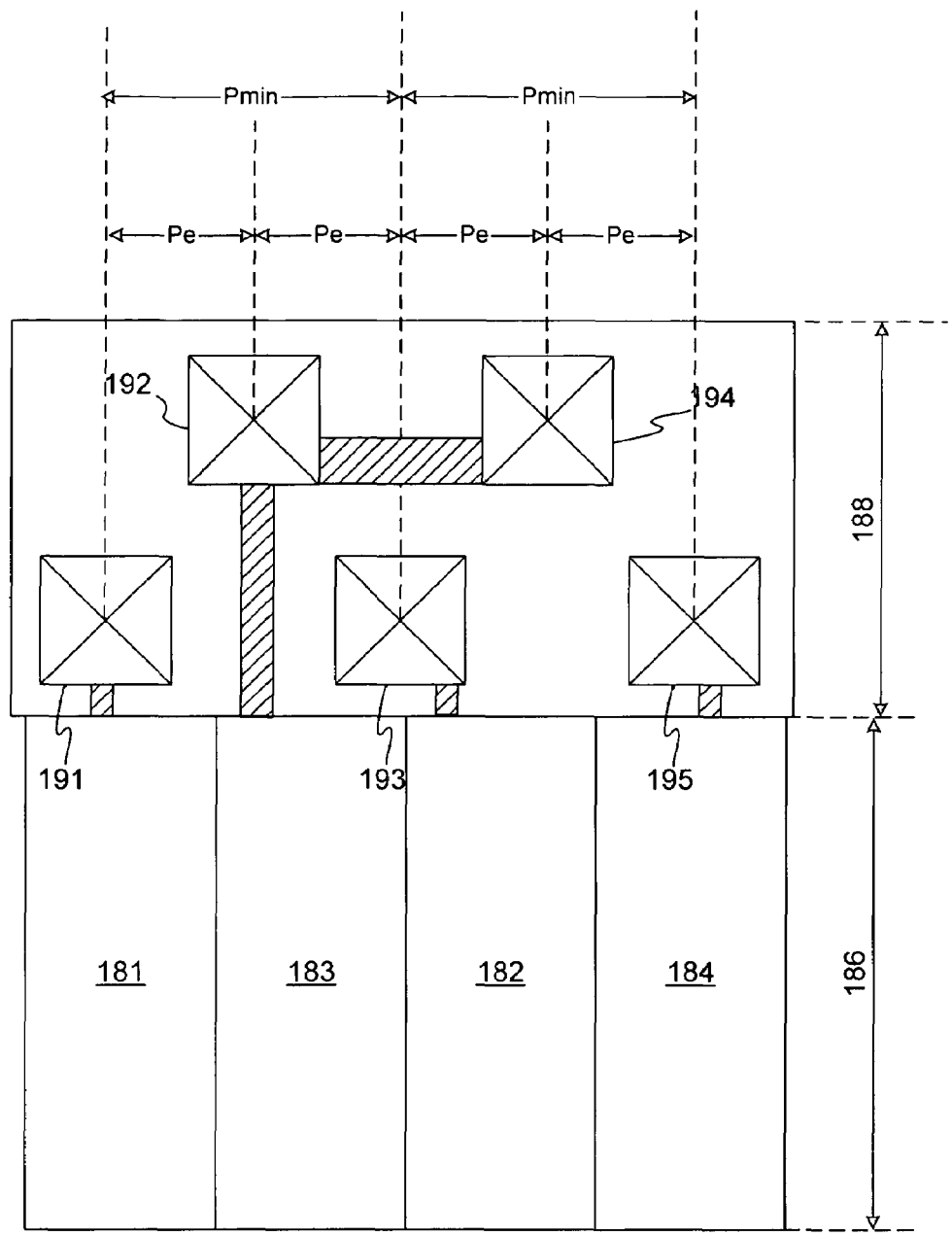

FIG. 7 illustrates another variation of the present disclosure, whereby the IO pads are staggered in two rows. For example, IO pads 191, 193, and 195 are in a first row, and IO pads 192 and 194 are in a second row. Staggering of IO pads allows an average effective pitch between the bond pads to be obtained that is less than the minimum pitch. For example, the distance between the pads in the first row can represent a minimum pad pitch. Likewise, the distance between the pads in the second row can represent a minimum pad pitch. However, because there are two rows, and the pads are offset from each other it is possible for the packaging equipment to properly bond each row of bond pads, and obtain the effective pitch (Pe) that is less than the minimum pitch. As illustrated in FIG. 7, it is possible to connect two or more bond pads together using traces. For example, bond pads 192 and 194 are connected together. It will be appreciated that multiple bond pads and/or bond pads from different rows can be connected together. This allows for a reduced impedance to be seen by a single active buffer 183.

In the foregoing specification, the disclosure has been described with reference to specific embodiments. However, one of ordinary skill in the art appreciates that various modifications and changes can be made without departing from the scope of the present disclosure as set forth in the claims below. For example, the buffers and buffer sets described herein may be part of a standard library so that they may be reused and or modified easily. The package that the bond pads are connected to can be any one of a standard or proprietary package. Such a package may have power rings that the power pads connect to, or can have discrete power pads that the bond pads connect to. Accordingly, the specification and figures are to be regarded in an illustrative rather than a restrictive sense, and all such modifications are intended to be included within the scope of present disclosure.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims

What is claimed is:

1. A method comprising:
   connecting a first bond pad to a first portion of a package, wherein the first portion of the package is to supply a predetermined voltage;
   connecting a second bond pad to a second portion of a package, wherein the second portion of the package is to supply the predetermined voltage; and
   wherein the first bond pad is connected to the second bond pad, and exactly one of the first bond pad and second bond pad is connected to an active buffer region, and a third bond pad is immediately adjacent to the second bond pad and to the first bond pad.

2. The method of claim 1, wherein the first portion of the package and the second portion of the package are electrically connected.

3. The method of claim 1, wherein a first pitch between the first bond pad and the third bond pad is less than an average pitch between buffers in the active buffer region.

4. The method of claim 1, wherein a first pitch between the first bond pad and the third bond pad is the same as a second pitch between the second bond pad and the third bond pad.

5. The method of claim 4, wherein the first pitch is a minimum allowable pitch.

6. The method of claim 4, wherein a fourth bond pad is immediately adjacent the second bond pad, and a third pitch between the second bond pad and the fourth bond pad is equal to the first pitch.

7. The method of claim 6, wherein the first pitch is a minimum allowable pitch.

8. The method of claim 4, wherein a fourth bond pad is immediately adjacent to the second bond pad, and a third pitch between the second bond pad and the fourth bond pad is different than the first pitch.

9. The method of claim 8, wherein the first pitch is a minimum allowable pitch.

10. A method comprising:
    disposing a signal buffer at a semiconductor substrate;
    disposing a power buffer immediately adjacent to the signal buffer at the semiconductor substrate;
    disposing first and second bond pads at the semiconductor substrate;
    coupling the first and second bond pads to the power buffer;
    disposing a third bond pad immediately adjacent to the first and second bond pads at the semiconductor substrate; and
    coupling the third bond pad to the signal buffer.

11. The method of claim 10, further comprising:
    coupling the second bond pad to the first bond pad.

12. The method of claim 10, wherein the signal buffer is one of an input buffer, an output buffer or a bidirectional buffer.

13. The method of claim 10, further comprising:
    coupling the first bond pad and third bond pad to a fixed voltage source.

* * * * *